United States Patent [19]

Patel et al.

[11] Patent Number: 5,534,371
[45] Date of Patent: Jul. 9, 1996

[54] REPAIRED APERTURED LASER METAL MASK

[75] Inventors: Rajesh S. Patel; Laertis Economikos, both of Wappingers Falls, N.Y.

[73] Assignee: International Business Machines Corporation, Armonk, N.Y.

[21] Appl. No.: 446,355

[22] Filed: May 22, 1995

[51] Int. Cl.⁶ .................................................. G03F 9/00
[52] U.S. Cl. ........................ 430/5; 430/297; 430/945; 216/12; 216/26; 216/65; 216/66
[58] Field of Search .............................. 430/5, 297, 945; 216/12, 26, 65, 66; 156/643

[56] References Cited

U.S. PATENT DOCUMENTS

| | | | |
|---|---|---|---|
| 4,463,073 | 7/1984 | Miyauchi et al. | 430/5 |
| 4,704,304 | 11/1987 | Amendola et al. | 427/57 |
| 4,786,358 | 11/1988 | Yamazaki et al. | 156/643 |
| 4,923,772 | 5/1990 | Kirch et al. | 430/5 |
| 5,193,732 | 3/1993 | Interrante et al. | 228/1.1 |
| 5,289,632 | 3/1994 | Chalco et al. | 29/846 |
| 5,349,155 | 9/1994 | Yamagishi et al. | 219/121.71 |

OTHER PUBLICATIONS

"Metal Film/Diamond Membrane Mask for Excimer Laser Ablation Projection Etching", IBM Technical Disclosure Bulletin, vol. 36, No. 11, pp. 583–584, Nov. 1993.

U.S. Patent Application Serial No. 08/410,030, filed on Mar. 24, 1995, entitled "Single Metal Mask for Laser Ablation".

*Primary Examiner*—S. Rosasco
*Attorney, Agent, or Firm*—Aziz M. Ahsan

[57] ABSTRACT

A repaired laser ablation mask is disclosed capable of withstanding laser fluences in the range from about 200 mJ/cm² to at least 500 mJ/cm². The repaired mask comprises a single or multiple layers of apertured metal, such as, aluminum, on a quartz substrate. The laser mask repair technique and structure are also disclosed. The thickness of the metal layer, such as, aluminum layer, is in the range from about 2 microns to about 6 microns. A laser projection etching technique is also disclosed for using the repaired ablation mask.

22 Claims, 1 Drawing Sheet

REPAIRED APERTURED LASER METAL MASK

CROSS-REFERENCE TO A RELATED PATENT APPLICATION

This Patent Application is related to U.S. patent application Ser. No. 08/446,356, entitled "Method of Repairing Apertured Laser Metal Mask", filed on May 22, 1995, assigned to the assignee of the instant Patent Application, and the disclosure of which is incorporated herein by reference.

FIELD OF THE INVENTION

The present invention relates generally to a new scheme to repair laser metal mask. More particularly, the invention encompasses the repair of laser metal masks, such as, aluminum metal on quartz type masks with a strip of metal, such as, gold. A method for such repair of laser metal masks is also disclosed.

BACKGROUND OF THE INVENTION

Some current laser ablation masks are fabricated by using apertured alternating layers of dielectric materials. For example, U.S. Pat. No. 4,923,772, issued to Steven J. Kirch et al. on May 8, 1990 and assigned to the present assignee, discloses an ablation mask having multiple dielectric layers of alternating high and low indices of refraction on a U.V. grade synthetic fused silica substrate. The described mask withstands the fluences of the high energy and high power lasers employed therewith. However, these masks are relatively expensive and complicated to fabricate and the constituent dielectric material is tailored for use with a particular wavelength laser. Hence, when the laser ablation wavelength changes, for example, when different target materials are desired to be ablated, a new dielectric mask with different dielectric material is required. U.S. Pat. No. 5,349,155 teaches the use of a similar mask.

Another type of laser ablation mask known in the art uses an apertured single layer or an apertured composite metal layer on a quartz substrate. Chromium, aluminum and copper-backed aluminum have been suggested for use as the metal. Brief mention is made in the aforementioned U.S. Pat. No. 4,923,772 that aluminum can be used as the metal provided that the energy density or fluence of the laser is in the range below 200 mJ/cm$^2$. The patent notes that patterned aluminum-on-silica masks cannot withstand the full range of the very high laser fluences encountered and that dielectric coated silica masks are preferred in the ranges of fluence greater than 100 mJ/cm$^2$. Chromium suffers the same damage disadvantage as does aluminum at about 200 mJ/cm$^2$ laser energy densities according to the teachings of aforementioned U.S. Pat. No. 4,923,772. It is to be noted that no mention is made of the thicknesses of the mask metal in the examples cited in the patent. Further citation of the use of chromium on quartz ablation masks is given in U.S. Pat. No. 4,786,358.

IBM Technical Disclosure Bulletin, entitled "Metal Films/Diamond Membrane Mask for Excimer Laser Ablation Projection Etching", Vol. 36, No. 11, pp. 583–584, (November 1993), describes a 3–5 μm thickness of aluminum deposited on CVD diamond and covered by an anti-reflecting coating for use as a laser ablation mask. The purpose of the diamond is to efficiently heat-sink the laser energy absorbed by the aluminum throughout the laser pulse duration. The described mask structure is somewhat expensive and complicate to fabricate. In the case where copper is substituted for diamond in order to provide similar heat dissipation, the formation of alloys of copper and aluminum at the aluminum-copper interface reduces the reflectance of the aluminum and increases the risk of metal mask feature destruction at high laser fluence.

PURPOSES AND SUMMARY OF THE INVENTION

The invention is a novel method for repairing laser metal masks that are used for laser ablation, and structure thereof.

Therefore, one purpose of this invention is to provide a method that will allow for easy repairs of laser metal masks that are used for laser ablation.

Another purpose of the present invention is to be able to repair a single or multi-layer metal-on-quartz mask that is used for laser ablation at laser fluences in the range from about 200 mJ/cm$^2$ to at least 500 mJ/cm$^2$.

Still another purpose is to repair a laser metal mask so that U.V. light beam can only pass through the desired areas on the laser metal mask.

Yet another purpose is to provide a laser ablation mask suitable for multiple wavelength use.

A further purpose is to provide a low cost laser ablation mask which can be fabricated easily.

An additional purpose is to provide a repaired single layer aluminum-on-quartz mask for laser ablation at laser fluences above about 200 mJ/cm$^2$.

These and other purposes of the present invention are achieved in a best mode embodiment thereof by forming a 2 to 6 micron thick apertured aluminum layer on a silica substrate. The layer must have a thickness to assure sufficient thermal mass to distribute the heating load during the ablation of target areas using the mask. The maximum thickness of the mask metal layer is limited by aperture resolution and aperture size control considerations in the metal layer. Resolution and dimensional control of the very small mask metal apertures required in the processing of microelectronic target material becomes a problem when the thickness of the mask metal exceeds about 6 microns.

Therefore, in one aspect this invention comprises a repaired laser metal mask for use intermediate a U.V. light source, said mask comprising:

a substrate of quartz, and at least one layer of apertured metal on said substrate, said layer having at least one defect, said layer of said apertured metal having at least one layer of metal strip secured thereto and covering said defect to prevent the penetration of said U.V. light source through said defect.

In another aspect this invention comprises a method of repairing laser metal masks, comprising:

(a) locating at least one defective area on an apertured laser metal mask, wherein said mask comprises at least one layer of apertured metal on a layer of quartz, (b) placing at least one layer of metal strip over said at least one defective area, such that said metal strip completely covers said defective area, (c) securing said at least one layer of metal strip to at least a portion of said defective area, such that no U.V. light beam can pass through said defective area, and thereby repairing said metal mask.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The laser metal mask as used herein means that the mask comprises at least one layer of metal on quartz. The single layer of metal on quartz could be aluminum, or if the mask has multiple layers then one could have the metal comprise of layers of aluminum, copper, gold, etc. This type of laser metal masks are typically used for laser ablation and/or laser patterning on electronic substrates and packages.

The present invention generally relates to laser metal masks for use in the processing of microelectronic materials and, more particularly, to laser ablation masks for the selective removal of target areas by the decomposition, evaporization or vaporization of the materials comprising the target areas using laser energy, which is preferably in the ultraviolet range.

The basic technique of laser projection etching, as practiced in connection with the present invention, is described in the aforementioned U.S. Pat. No. 4,923,772. Briefly, the energy from a laser source is directed through a separate, re-usable mask to fall directly on the target substrate or to be processed (e.g., reduced) through a projector arrangement and subsequently directed onto the target. The mask comprises a transparent body with an opaque pattern formed thereon.

Absorption of the laser energy by the mask material is the cause of the degradation and eventual destruction of the mask patterns. Not only must the opaque pattern (such as an apertured reflecting aluminum film) have a planar inclusion free surface, but the transparent body should also be free of impurities. U.V. grade synthetic fused silica is preferred for use as the transparent body. An excimer laser is preferred as the U.V. source.

As previously noted in the discussion of the prior art, the conventional teaching is that single layer metal on silica substrates are not suitable for use as ablation masks at laser fluences above 200 mJ/cm$^2$. It has been found, however, in accordance with the present invention, that a layer of apertured aluminum on a silica substrate indeed can be used efficiently as an ablation mask provided that the thickness of the aluminum is at least 2 microns. Such a thickness has proven to be sufficient to withstand laser fluences in the range from above about 200 mJ/cm$^2$ to at least 500 mJ/cm$^2$ which is the energy range associated with laser ablation practice. An upper thickness limit of 6 microns for the aluminum avoids resolution difficulties with respect to the aperture sizes required in the aluminum for the processing of microelectronic target material. Available laser wavelengths of 193, 248 and 308 nm are suitable.

Figure 1:
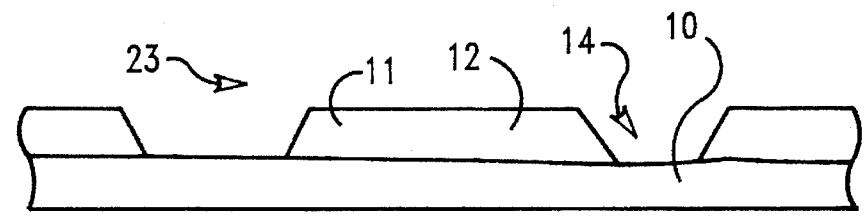
FIG. 1, illustrates a simplified cross-sectional view of a laser metal mask.

FIG. 1, is a simplified cross-sectional view of a laser ablation mask 23, fabricated in accordance with the present invention and tested under various operating conditions as will be described. Incident radiation represented by arrows 20 from a U.V. light source or beam, such as, for example, excimer laser or mercury arc lamp, etc., impinges upon quartz substrate 10. Preferably quartz 10 is U.V. grade synthetic fused silica in order to minimize laser absorption by impurities or inclusions therein. A single or multiple layer of apertured metal 12, such as, a single layer of apertured aluminum 12, is formed on the quartz substrate 10. For the purposes of illustration only a single layer of apertured aluminum 12, on quartz substrate 10, has been shown in the Figures, however it should be understood that the apertured metal 12, could comprise multiple layers of metal.

It should be noted that openings or apertures 14, allow the U.V. light beam 20, to easily pass through the laser metal mask 23, while the metallic portion 11, of the apertured metal layer 12, completely blocks the passage of U.V. light beam 20.

In one study, the damage threshold from a single shot laser pulse made at 308 nm wavelength was found to be 2500 mJ/cm$^2$ when the metal layer 12, was 3 microns thick. This is a very significant improvement over the 800 mJ/cm$^2$ single shot damage threshold of currently employed multiple layered dielectric ablation masks. The extended lifetime damage threshold (using uninterrupted repetitive pulsing of the laser) was not reached in a second test. The repaired mask of this invention successfully survived a ½ million pulse static test at 308 nm, 250 mJ/cm$^2$ and 300 Hz.

Actual laser ablation of 500 target microelectronic substrates revealed no mask degradation using a 308 nm laser at 250 mJ/cm$^2$, 300 Hz. It was noted that the target substrate ablation results using the described aluminum mask functionally and aesthetically appeared to be the same as the ablation results using the prior art multiple layer dielectric mask alluded to earlier. Thus, it was shown that the single layer aluminum mask of the present invention is a low cost (simple fabrication steps), high lifetime mask alternative to the multiple layer dielectric mask for laser ablation applications.

Figure 2:
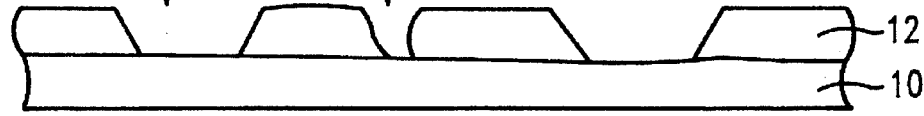
FIG. 2, illustrates a cross-sectional view of a defective laser metal mask.

FIG. 2, illustrates a cross-sectional view of a defective single metal laser ablation mask 25. A defect 16, appears in an undesired area of the mask 25. The defect 16, could be a hole or an opening or a separation in the aluminum layer 12. The defect 16, is typically of such a nature that it allows either complete passage or partial passage, to the U.V. light beam 20, through the defective mask 25. In either case the usefulness of the mask 25, is substantially diminished. Therefore, the inventors have discovered a way to salvage the defective mask 25, by repairing the defect 16, and making the mask 25, fully operational.

Figure 3:
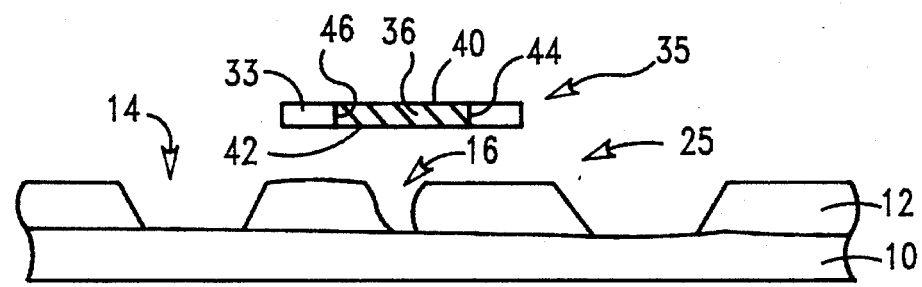
FIG. 3, illustrates a cross-sectional view of a decal used to repair the defective laser metal mask.

FIG. 3, illustrates a cross-sectional view of a decal 35, that could be used to repair the defective single metal laser ablation mask 25. The decal 35, basically comprises of a metallic portion or a metal strip 36, and a support portion 33.

The metallic portion 36, has top surface 40, and bottom surface 42, which are fully exposed, i.e, the surfaces 40 and 42, preferably do not have any material that could be harmful to the repair process. The walls 46, of the metallic portion 36, are supported or held or suspended in place by the walls 44, of the support portion 33.

The metallic portion 36, which could comprise of a single or multiple layer of metal, and wherein the metal for the metallic portion 36, could be selected from a group comprising aluminum, antimony, bismuth, chromium, cobalt, copper, gold, indium, lead, molybdenum, nickel, palladium, platinum, silver, tin, titanium, tungsten and alloys thereof.

While, the support portion 33, could comprise of a single or multiple layer of material, and wherein the material for the support portion 33, could be selected from a group comprising of polyimide, epoxy, to name a few.

The decal 35, is placed over the defect 16, such that the decal 35, completely covers the defect 16. Care should be taken to ensure that the metallic portion 36, of the decal 35, is large enough to not only cover the defect 16, but that there is material left at the periphery that can be used to secure the metallic portion 36, to the upper surface of the area around the defect 16.

Figure 4:
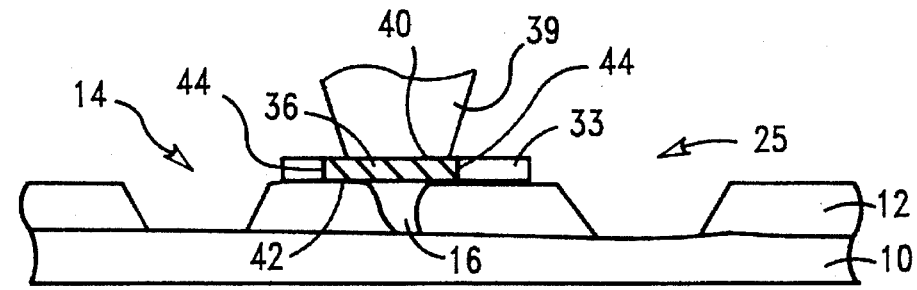
FIG. 4, illustrates a cross-sectional view of a bonder tip that is used to apply the decal to repair the defective laser metal mask.

FIG. 4, illustrates a cross-sectional view of a bonder tip 39, that is used to bond the decal 35, onto the defective single metal laser ablation mask 25. The tip 39, is preferably secured to an ultrasonic horn or bonder (not shown). The bonder tip 39, makes contact with the exposed top surface 40, and forces the exposed bottom surface 42, to make contact with the upper surface of the metal 12, over the defect 16, such that the defect 16, is completely covered or enveloped. The bonder tip 39, is then energized and it secures the metallic portion 36, of the decal 35, to area surrounding the defect 16.

During the bonding of the metallic portion 36, to the defect 16 or the defective area 16, the walls 44, of the support portion 33, let go of the walls 46, of the metallic portion 36, and the decal 35, is pulled away from the defective area 16, along with the bonding tip 39. Any residue of the support portion 33, on the walls 46, of the metallic portion 36, or on the surface of the area surrounding the repaired defect can be cleaned by methods well known in the art.

Another method of securing the metallic portion 36, to the defective area 16, could be by using ultrasonic vibration and laser heating as described in U.S. Pat. No. 4,970,365 (Chalco), the disclosure of which is incorporated herein by reference. The bonding tip 39, is then energized so as to bond the metallic portion 36, to the defective area 16.

The bonding method of the metallic portion 36, to the metallic portion of the laser mask 23, could be selected from a group comprising ultrasonic bonding, thermal compression bonding or lasersonic bonding.

For some repairs it would be preferred that the defective area 16, is site dressed, so that a good and secure bond is obtained between the metallic portion 36, and the defective area 16. This site dressing could be done by removing at least a portion of the defective area or by removing at least a portion of the surface surrounding the defective area.

Figure 5:
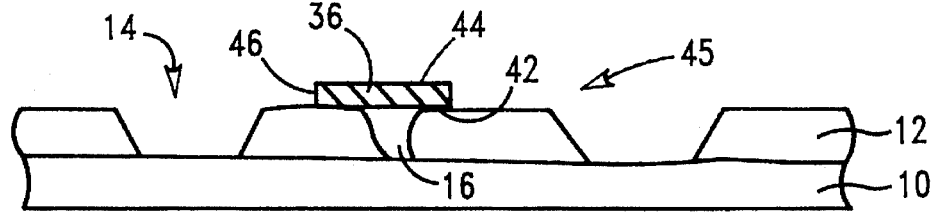
FIG. 5, illustrates a cross-sectional view of the defective laser metal mask after it has been repaired.

FIG. 5, illustrates a cross-sectional view of the defective laser metal mask 25, after it has been repaired to form a useable laser metal mask 45. Radiation 20, can now easily pass through the openings 14, while the metal portion 36, blocks and prevents any radiation 20, from going through the defective area 16.

Figure 6:
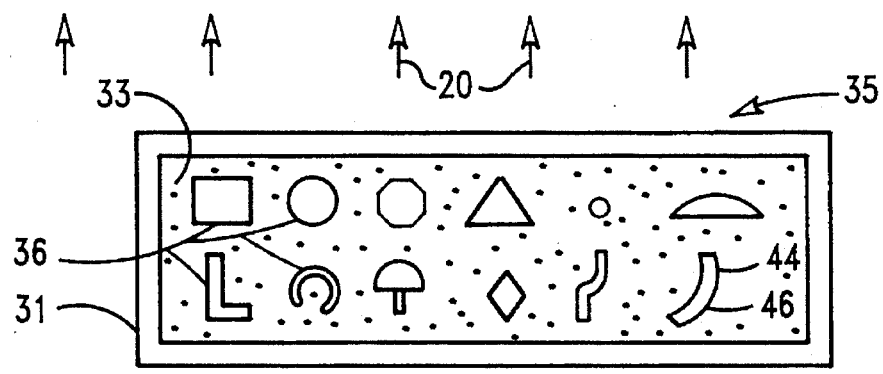
FIG. 6, illustrates a carrier with repair features suspended or embedded therein.

FIG. 6, illustrates a carrier or decal 35, with metallic repair portion or features 36, that are suspended or embedded in the support portion 33. The decal 35, could also have a frame 31, to securely hold the support portion 33, and the metallic repair portion 36. As can be clearly seen in FIG. 6, that the metallic portion 36, that is used for repairs could be of any shape or size, for example, the shape of the metallic portion 36, could be selected from a group comprising a rectangular shape, a circular shape, a polygonal shape, a triangular shape, or any irregular shape, to name a few.

As stated earlier that the laser metal mask 23, could comprise a single layer of metal 12, or a multi-layer metal 12, or a layer of multiple metals 12. In any case the material for the metal layer 12, could be selected from a group comprising aluminum, antimony, bismuth, chromium, cobalt, copper, gold, indium, lead, molybdenum, nickel, palladium, platinum, silver, tin, titanium, tungsten and alloys thereof.

Similarly, as stated earlier that the metallic decal 36, could comprise a single layer of metal 36, or a multi-layer metal 36, or a layer of multiple metals 36. In any event the material for the metallic strip 36, could be selected from a group comprising aluminum, antimony, bismuth, chromium, cobalt, copper, gold, indium, lead, molybdenum, nickel, palladium, platinum, silver, tin, titanium, tungsten and alloys thereof.

In some cases it may be desirous to cover one or more of the apertures or openings 14, in the laser metal mask 23. Or it might be necessary to block a portion of the aperture or opening 14, in the laser metal mask 23. In both these situations one could easily use the mask and the "repair" method of this invention. The metallic strip 36, that is placed over the opening 14, could be construed as a "repair" of the mask 23, as the already formed opening or aperture 14, in the mask 23, is now being fully or partially closed with a metal strip 36, to fully or partially block the passage of a U.V. light beam or source 20, and therefore the repair method and structure of this invention would also encompass this "repair" situation. Therefore, the defect 16, could be an aperture or opening 14, in the mask 23, that needs to be fully or partially blocked from the passage of U.V. light beam 20.

The method of repairing laser metal mask of this invention can be used to repair metal masks, such as, for example, disclosed in U.S. patent application Ser. No. 08/410,030, filed on Mar. 24, 1995, entitled "Single Metal Mask For Laser Ablation", the disclosure of which is incorporated herein by reference.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A repaired laser metal mask for use intermediate a U.V. light source, said mask comprising:

a substrate of quartz, and at least one layer of apertured metal having a lower surface and an upper surface, wherein said lower surface is in direct contact with said substrate, said layer of apertured metal having at least one defect, wherein at least one layer of metal strip is secured over said at least one defect to at least a portion of said upper surface, such that said at least one layer of metal strip completely covers said at least one defect and prevents the penetration of said U.V. light source through said at least one defect.

2. The repaired mask of claim 1, wherein said U.V. light source is selected from a group consisting of excimer laser or mercury arc lamp.

3. The repaired mask of claim 1, wherein the area around said defect is site dressed.

4. The repaired mask of claim 1, wherein at least one material for said at least one layer of apertured metal is selected from a group consisting of aluminum, antimony, bismuth, chromium, cobalt, copper, gold, indium, lead, molybdenum, nickel, palladium, platinum, silver, tin, titanium, tungsten and alloys thereof.

5. The repaired mask of claim 1, wherein at least one material for said at least one layer of metal strip is selected from a group consisting of aluminum, antimony, bismuth, chromium, cobalt, copper, gold, indium, lead, molybdenum, nickel, palladium, platinum, silver, tin, titanium, tungsten and alloys thereof.

6. The repaired mask of claim 1, wherein the thickness of said at least one layer of apertured metal is in the range from about 2 microns to about 6 microns.

7. The repaired mask of claim 1, wherein the average thickness of said at least one layer of apertured metal is about 3 microns.

8. The repaired mask of claim 1, wherein said substrate of quartz is a U.V. grade synthetic fused silica.

9. The repaired mask of claim 1, wherein said repaired mask withstands a fluence in the range from about 200 mJ/cm$^2$ to about at least 500 mJ/cm$^2$.

10. The repaired mask of claim 1, wherein the shape of said metallic portion is selected from a group consisting of a rectangular shape, a circular shape, a polygonal shape, a triangular shape, or any irregular shape.

11. The repaired mask of claim 1, wherein said metal strip is held in place with a support portion.

12. The repaired mask of claim 1, wherein said metal strip is held in place with a support portion, and wherein said support portion is selected from a group consisting of polyimide and epoxy.

13. A repaired laser metal mask for use intermediate an excimer laser providing a fluence in the range from about 200 mJ/cm$^2$ to at least 500 mJ/cm$^2$ and a target structure having features to be ablated, said repaired mask comprising:

a substrate of quartz, and a single layer of apertured metal having a lower surface and an upper surface, wherein said lower surface is in direct contact with said substrate, said layer of apertured metal having at least one defect, wherein at least one strip of metal is secured over said at least one defect to at least a portion of said upper surface, such that said at least one strip of metal completely covers said at least one defect and prevents the penetration of said excimer laser through said at least one defect.

14. The repaired mask of claim 13, wherein the area around said defect is site dressed.

15. The repaired mask of claim 13, wherein at least one material for said at least one layer of apertured metal is selected from a group consisting of aluminum, antimony, bismuth, chromium, cobalt, copper, gold, indium, lead, molybdenum, nickel, palladium, platinum, silver, tin, titanium, tungsten and alloys thereof.

16. The repaired mask of claim 13, wherein at least one material for said at least one layer of strip of metal is selected from a group consisting of aluminum, antimony, bismuth, chromium, cobalt, copper, gold, indium, lead, molybdenum, nickel, palladium, platinum, silver, tin, titanium, tungsten and alloys thereof.

17. The repaired mask of claim 13, wherein the thickness of said at least one layer of apertured metal is in the range from about 2 microns to about 6 microns.

18. The repaired mask of claim 13, wherein the average thickness of said at least one layer of apertured metal is about 3 microns.

19. The repaired mask of claim 13, wherein said substrate of quartz is a U.V. grade synthetic fused silica.

20. The repaired mask of claim 13, wherein the shape of said metallic portion is selected from a group consisting of a rectangular shape, a circular shape, a polygonal shape, a triangular shape, or any irregular shape.

21. The repaired mask of claim 13, wherein said metal strip is held in place with a support portion.

22. The repaired mask of claim 13, wherein said metal strip is held in place with a support portion, and wherein said support portion is selected from a group consisting of polyimide and epoxy.

* * * * *